United States Patent
Chou et al.

(10) Patent No.: US 7,791,276 B2
(45) Date of Patent: Sep. 7, 2010

(54) LIGHT-EMITTING DEVICE WITH MINIATURE ELEMENTS

(75) Inventors: Wei-Jen Chou, Hsinchu (TW); Shih-Yuan Yu, Hsinchu (TW); Wei-Chih Wang, Hsinchu (TW)

(73) Assignee: Young Lighting Technology Corporation, Hsinchu (TW)

( * ) Notice: Subject to any disclaimer, the term of this patent is extended or adjusted under 35 U.S.C. 154(b) by 152 days.

(21) Appl. No.: 12/106,487

(22) Filed: Apr. 21, 2008

(65) Prior Publication Data
US 2009/0140650 A1     Jun. 4, 2009

(30) Foreign Application Priority Data
Dec. 4, 2007   (TW) ................. 96146067 A

(51) Int. Cl.
  *H01J 1/62* (2006.01)
  *H01J 63/04* (2006.01)
(52) U.S. Cl. ........................ 313/512; 257/98
(58) Field of Classification Search ............... 313/111; 257/98; 362/555
See application file for complete search history.

(56) References Cited
U.S. PATENT DOCUMENTS
7,390,117 B2 * 6/2008 Leatherdale et al. ........ 362/555
2005/0082974 A1 * 4/2005 Fukasawa et al. .......... 313/512
2006/0091798 A1 * 5/2006 Ouderkirk et al. .......... 313/512
2007/0085102 A1 * 4/2007 Orita ........................... 257/98
2007/0170449 A1 * 7/2007 Anandan ..................... 257/98
2008/0042154 A1 * 2/2008 Wano ........................... 257/98

FOREIGN PATENT DOCUMENTS
TW        I232001        5/2005

* cited by examiner

Primary Examiner—Toan Ton
Assistant Examiner—Britt D Hanley
(74) Attorney, Agent, or Firm—Thomas, Kayden, Horstemeyer & Risley

(57) ABSTRACT

A light-emitting device includes a package housing, at least one light-emitting element, a plurality miniature elements, and a package filler. The package housing includes a recess. The light-emitting element is disposed in the recess. The miniature elements are formed on the light-emitting element. Light from the light-emitting element is output to the exterior of the recess in a predetermined direction by adjustment of the miniature elements. The package filler is filled in the recess and covers the light-emitting element and miniature elements.

12 Claims, 7 Drawing Sheets

LIGHT-EMITTING DEVICE WITH MINIATURE ELEMENTS

BACKGROUND OF THE INVENTION

1. Field of the Invention

The invention relates to a light-emitting device, and more particularly to a light-emitting device with a uniform light-mixing effect.

2. Description of the Related Art

Some light-emitting devices can output white light by mixing light from red-light, green-light, and blue-light light-emitting diode (LED) chips.

Referring to FIG. 1, a conventional light-emitting device 1 includes a package housing 10, a red-light LED chip 21, a green-light LED chip 22, a blue-light LED chip 23, and a transparent package filler 30.

The package housing 10 may be composed of white plastic or ceramic material.

The red-light LED chip 21, green-light LED chip 22, and blue-light LED chip 23 are disposed in the package housing 10 and separated from one another. Moreover, the red-light LED chip 21, green-light LED chip 22, and blue-light LED chip 23 may be arranged in a triangular form as shown by FIG. 2A or a linear form as shown by FIG. 2B.

The transparent package filler 30 may comprise silicone sealant. The transparent package filler 30 is filled in the package housing 10 and covers the red-light LED chip 21, green-light LED chip 22, and blue-light LED chip 23.

When the red-light LED chip 21, green-light LED chip 22, and blue-light LED chip 23 simultaneously irradiate, light output therefrom does not possess directionality and is scattered by an inner wall of the package housing 10, thus forming asymmetric irradiation areas, and further causing a non-uniform light mixing effect. For example, as shown in FIG. 2A or FIG. 2B, the red-light LED chip 21 contributes to a red irradiation area R near the center of the package housing 10, the green-light LED chip 22 contributes to a green irradiation area G near the right of the package housing 10, and the blue-light LED chip 23 contributes to a blue irradiation area B near the left of the package housing 10. Because the light output from the red-light LED chip 21, green-light LED chip 22, and blue-light LED chip 23 is scattered by the inner wall of the package housing 10 and the distribution of light intensity in the red irradiation area R, green irradiation area G, and blue irradiation area B is not uniform, a mixed white-light area W (depicted by diagonal lines) formed by overlapping the red irradiation area R, green irradiation area G, and blue irradiation area B is small and the light color thereof is not uniform. Moreover, other mixed colored-light areas are formed around the mixed white-light area W by overlapping of every two of the red irradiation area R, green irradiation area G, and blue irradiation area B. Accordingly, as the effective mixed white-light area provided by light-emitting device 1 is small and a white-light mixing effect provided thereby is poor, the efficiency of optical application of the light-emitting device 1 is low. Namely, utility of light color of the light-emitting device 1 is low.

BRIEF SUMMARY OF THE INVENTION

A detailed description is given in the following embodiments with reference to the accompanying drawings.

An exemplary embodiment of the invention provides a light-emitting device including a package housing with a recess, at least one light-emitting element, disposed in the recess; a plurality of miniature elements formed on the light-emitting element, and a package filler. Light from the light-emitting element is output to the exterior of the recess in a predetermined direction by adjustment of the miniature elements. The package filler is filled in the recess and covers the light-emitting element and miniature elements.

According to an embodiment of the invention, each miniature element includes a triangular pyramid.

According to an embodiment of the invention, each miniature element includes a square-based pyramid.

According to an embodiment of the invention, each miniature element includes a cone.

According to an embodiment of the invention, the light-emitting element includes a light-emitting diode chip.

Other objectives, features and advantages of the present invention will be further understood from the further technology features disclosed by the embodiments of the present invention wherein there are shown and described preferred embodiments of this invention, simply by way of illustration of modes best suited to carry out the invention.

BRIEF DESCRIPTION OF THE DRAWINGS

The invention can be more fully understood by reading the subsequent detailed description and examples with references made to the accompanying drawings, wherein.

DESCRIPTION OF THE PREFERRED EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component directly or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
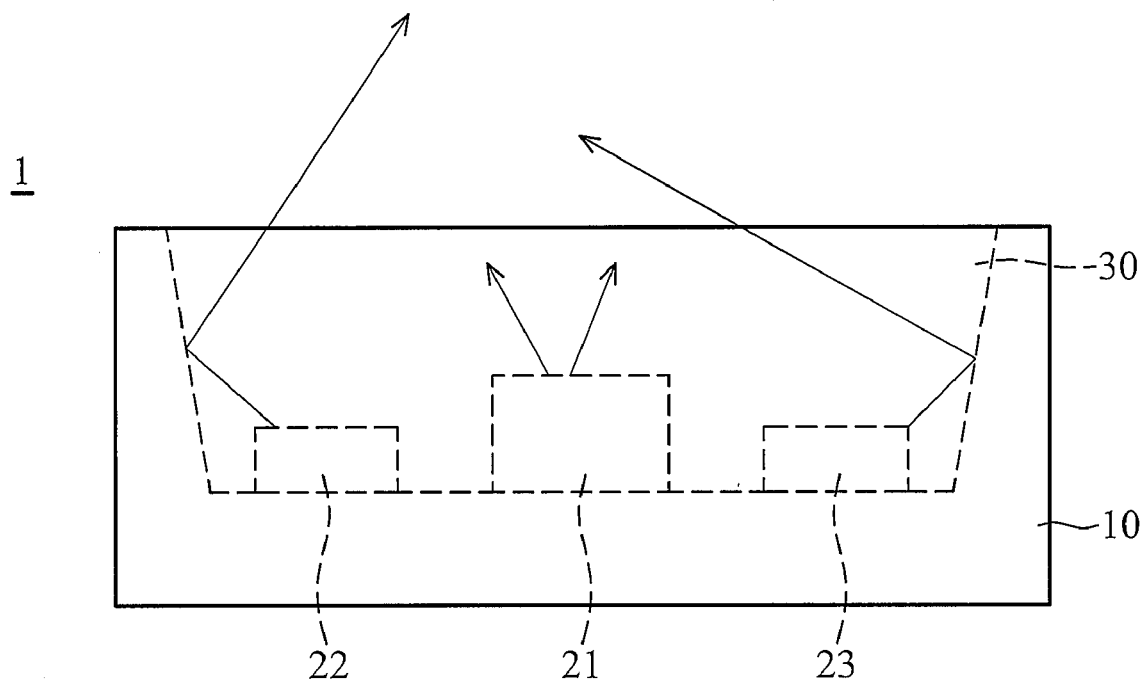
FIG. 1 is a schematic side view of a conventional light-emitting device.
Figure 2A:
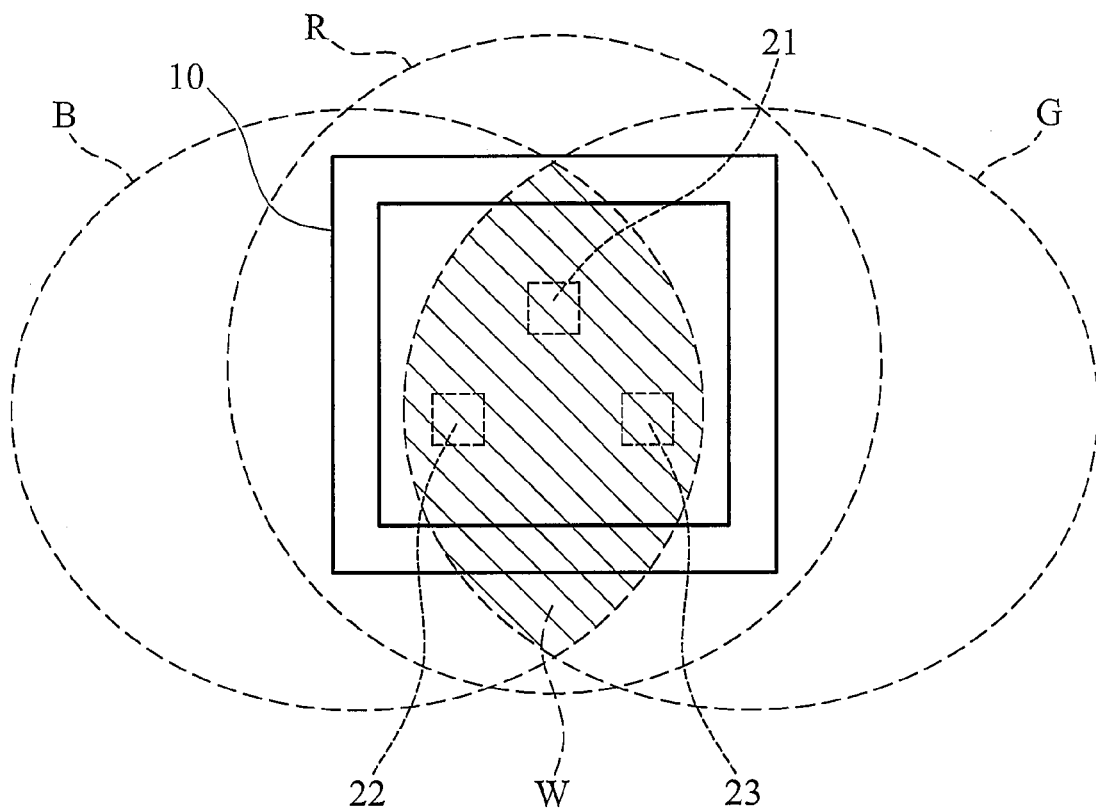
FIG. 2A is a schematic top view of the conventional light-emitting device of FIG. 1.
Figure 2B:
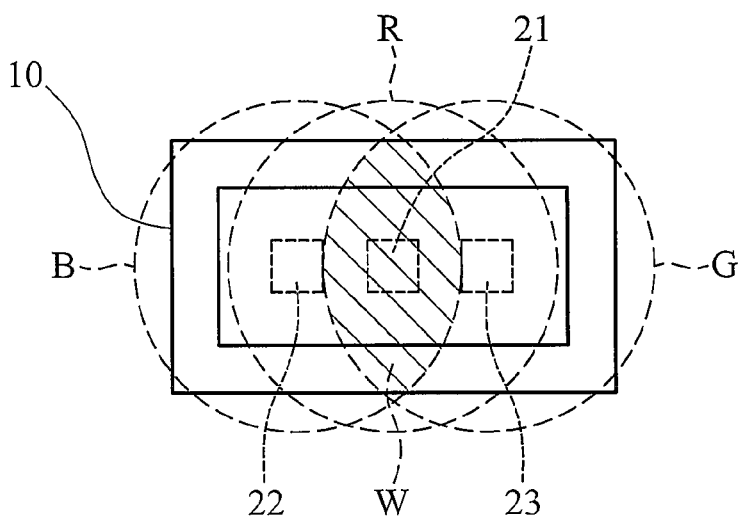
FIG. 2B is another schematic top view of the conventional light-emitting device of FIG. 1.
Figure 3:
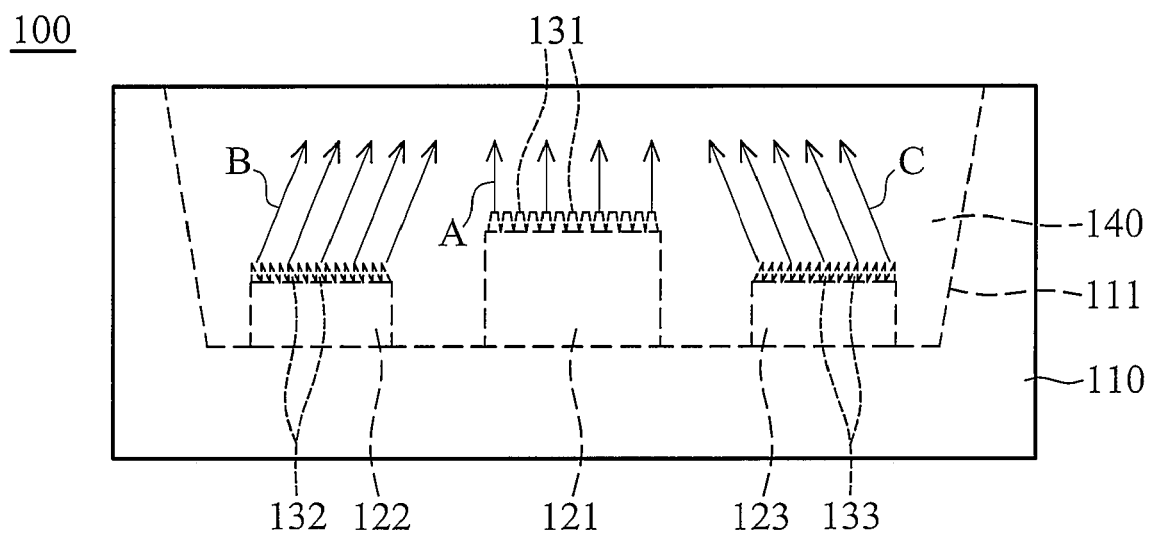
FIG. 3 is a schematic side view of a light-emitting device according to an embodiment of the invention.

Referring to FIG. 3, a light-emitting device 100 includes a package housing 110, a first light-emitting element 121, a second light-emitting element 122, a third light-emitting element 123, a plurality of first miniature elements 131, a plurality of second miniature elements 132, a plurality of third miniature elements 133, and a package filler 140.

The package housing 110 may be composed of plastic or ceramic material and includes a recess 111.

The first light-emitting element 121, second light-emitting element 122, and third light-emitting element 123 are disposed in the recess 111 of the package housing 110 and separated from one another. In this embodiment, the first light-emitting element 121, second light-emitting element 122, and third light-emitting element 123 include a red-light light-emitting diode chip, a green-light light-emitting diode chip, and a blue-light light-emitting diode chip, respectively. Additionally, the first light-emitting element 121, second light-emitting element 122, and third light-emitting element 123 may be arranged in a linear form as shown by FIG. 4A or a triangular form as shown by FIG. 4B.

Figure 5A:
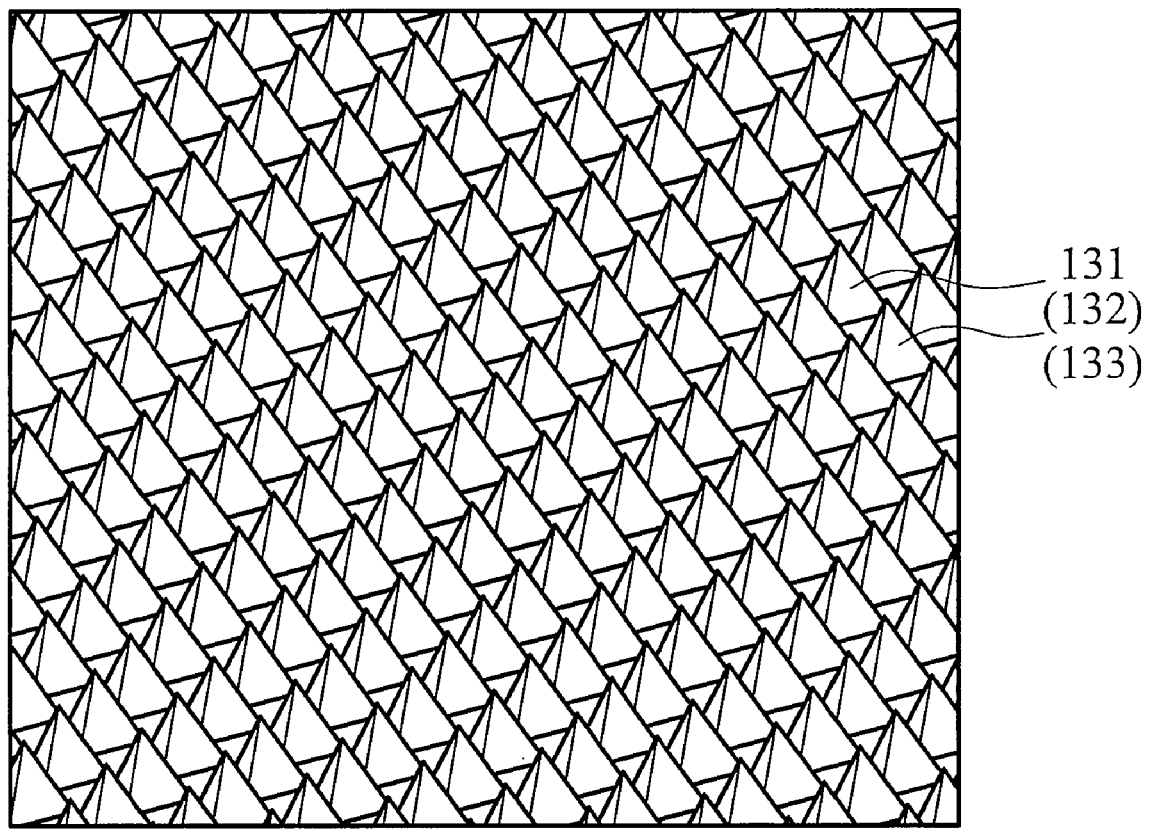
FIG. 5A is a schematic perspective view of miniature elements of a light-emitting device according to an embodiment of the invention.
Figure 5B:
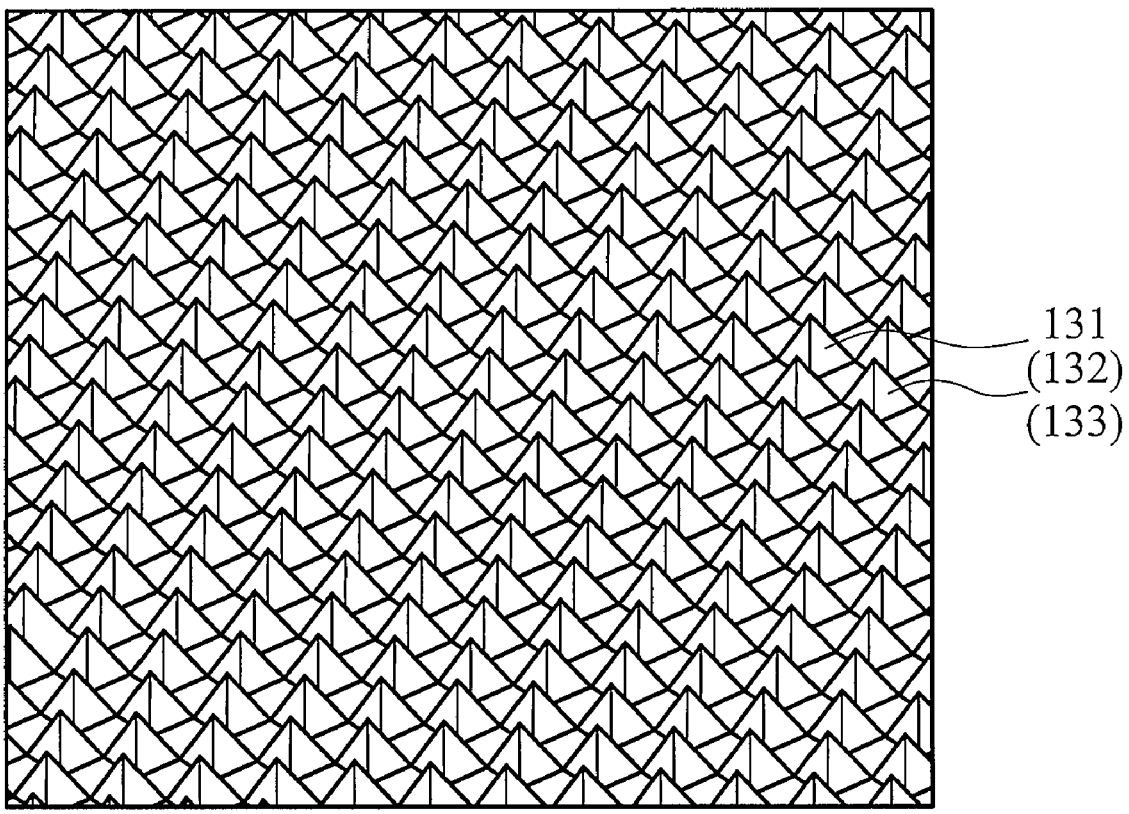
FIG. 5B is a schematic perspective view of miniature elements of a light-emitting device according to another embodiment of the invention.
Figure 5C:
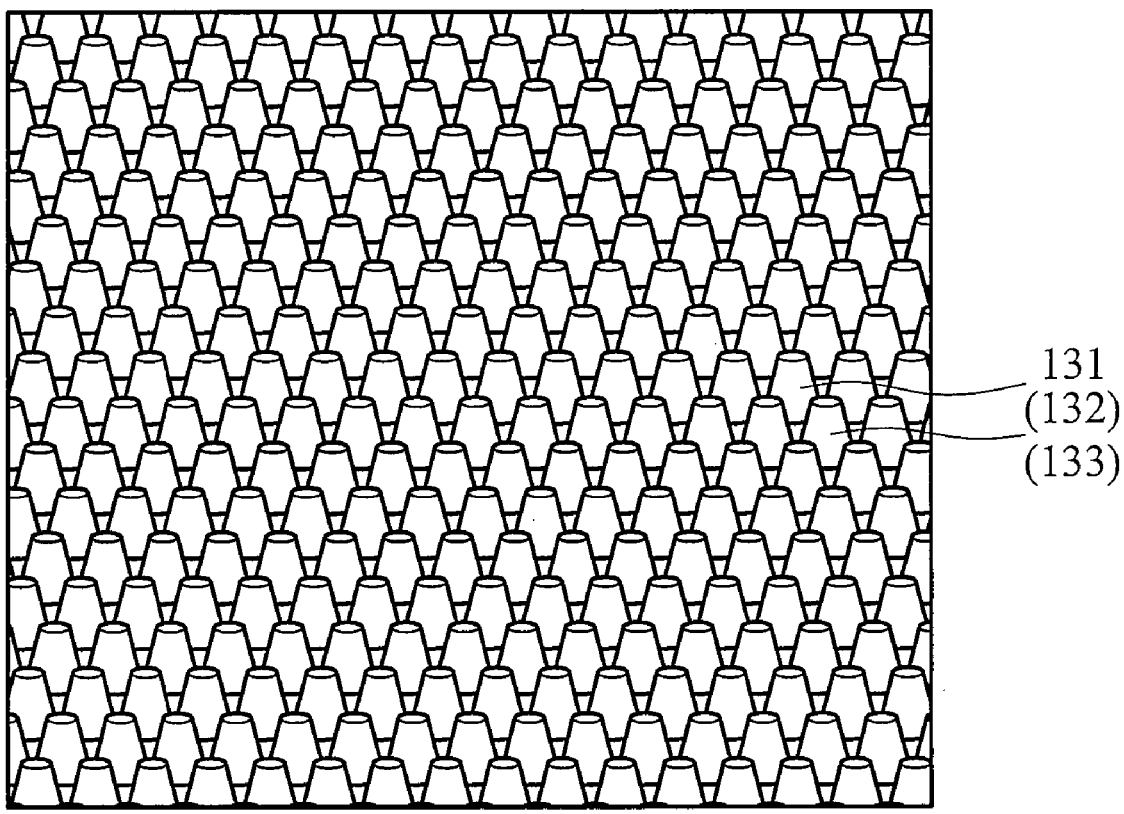
FIG. 5C is a schematic perspective view of miniature elements of a light-emitting device according to yet another embodiment of the invention.

As shown in FIG. 3, the first miniature elements 131 are formed on the first light-emitting element 121 and may change the direction of light output from the first light-emitting element 121. The second miniature elements 132 are formed on the second light-emitting element 122 and may change the direction of light output from the second light-emitting element 122. The third miniature elements 133 are formed on the third light-emitting element 123 and may change the direction of light output from the third light-emitting element 123. Here, the first miniature elements 131, second miniature elements 132, and third miniature elements 133 may be respectively formed on the first light-emitting element 121, second light-emitting element 122, and third light-emitting element 123 by an epitaxial, etching, or printing process. Moreover, the first miniature elements 131, second miniature elements 132, and third miniature elements 133 may be provided with any geometric profile. For example, the first miniature elements 131, second miniature elements 132, and third miniature elements 133 may be triangular pyramids (as shown in FIG. 5A), square-based pyramids (as shown in FIG. 5B), or cones (as shown in FIG. 5C). In this embodiment, the first miniature elements 131, second miniature elements 132, and third miniature elements 133 are cones, triangular pyramids, and square-based pyramids, respectively. Additionally, the first miniature elements 131, second miniature elements 132, and third miniature elements 133 can be respectively formed on the first light-emitting element 121, second light-emitting element 122, and third light-emitting element 123 with a regularly or irregularly arranged manner.

Figure 4A:
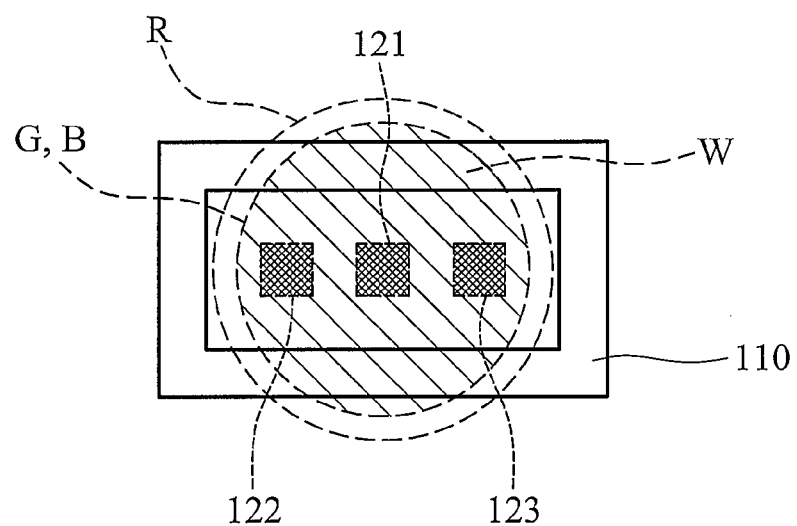
FIG. 4A is a schematic top view of a light-emitting device according to an embodiment of the invention.
Figure 4B:
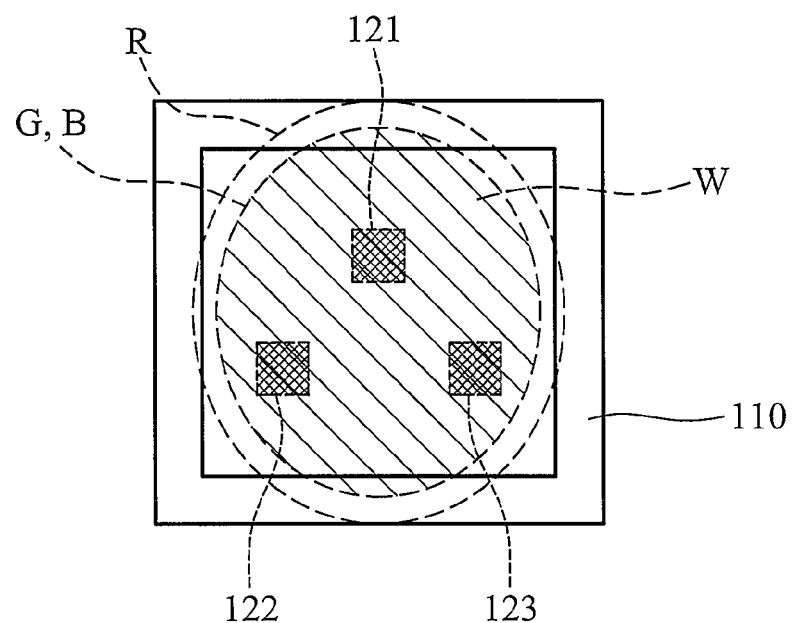
FIG. 4B is a schematic top view of a light-emitting device according to another embodiment of the invention.

As shown in FIGS. 3, 4A, and 4B, the package filler 140, such as silicone sealant or epoxy resin, is filled in the recess 111 of the package housing 110 and covers the first light-emitting element 121, second light-emitting element 122, third light-emitting element 123, first miniature elements 131, second miniature elements 132, and third miniature elements 133.

As shown in FIG. 3, the light from the first light-emitting element 121 is output To the exterior of the recess 111 of the package housing 110 in a first direction A by adjustment (such as refraction and reflection) of the first miniature elements 131, the light from the second light-emitting element 122 is output to the exterior of the recess 111 of the package housing 110 in a second direction B by adjustment (such as refraction and reflection) of the second miniature elements 132, and the light from the third light-emitting element 123 is output to the exterior of the recess 111 of the package housing 110 in a third direction C by adjustment (such as refraction and reflection) of the third miniature elements 133. Specifically, by controlling focus and divergent angle of the light with the first miniature elements 131, second miniature elements 132, and third miniature elements 133, the light output from the first light-emitting element 121, second light-emitting element 122, and third light-emitting element 123 possess directionality. For example, as shown in FIG. 4A and FIG. 4B, the first light-emitting element (red-light light-emitting diode chip) 121 contributes to a red irradiation area R near the center of the package housing 110 while the second light-emitting element (green-light light-emitting diode chip) 122 and third light-emitting element (blue-light light-emitting diode chip) 123 respectively contribute to a green irradiation area G and a blue irradiation area B near the center of the package housing 110. Here, as the light output via the first miniature elements 131, second miniature elements 132, and third miniature elements 133 is not scattered by an inner wall of the package housing 110, the red irradiation area R, green irradiation area G, and blue irradiation area B respectively contributed by the first light-emitting element 121, second light-emitting element 122, and third light-emitting element 123 concentrate and distribution of light intensity therein is uniform. Thus, a mixed white-light area W (depicted by diagonal lines) formed by overlapping of the red irradiation area R, green irradiation area G, and blue irradiation area B is increased and the light color thereof is uniform.

In conclusion, as the light-emitting device 100 can adjust the irradiation direction of the light output from the first light-emitting element (red-light light-emitting diode chip) 121, second light-emitting element (green-light light-emitting diode chip) 122, and third light-emitting element (blue-light light-emitting diode chip) 123 and uniform the distribution of light intensity in the red irradiation area R, green irradiation area G, and blue irradiation area B contributed thereby using the first miniature elements 131, second miniature elements 132, and third miniature elements 133, an effective mixed white-light area provided by the light-emitting device 100 is increased and the white-light mixing effect provided thereby is enhanced. Accordingly, the efficiency of optical application of the light-emitting device 100 is promoted. Namely, utility of light color of the light-emitting device 100 is promoted.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light-emitting device, comprising:
   a package housing providing a recess;
   a first light-emitting element disposed in the recess;
   a plurality of first miniature elements formed on the first light-emitting element, wherein light from the first light-emitting element passes through the first miniature elements to the exterior of the recess in a first direction;
   a second light-emitting element disposed in the recess;
   a plurality of second miniature elements formed on the second light-emitting element, wherein light from the second light-emitting element passes through the second miniature elements to the exterior of the recess in a second direction, and the shape of the first miniature elements and the shape of the second miniature elements are different, and the first direction crosses the second direction; and
   a package filler filled in the recess and covering the first and the second light-emitting elements and the first and the second miniature elements.

2. The light-emitting device as claimed in claim 1, wherein each of the first miniature elements comprises a triangular pyramid.

3. The light-emitting device as claimed in claim 1, wherein each of the first miniature elements comprises a square-based pyramid.

4. The light-emitting device as claimed in claim 1, wherein each of the first miniature elements comprises a cone.

5. The light-emitting device as claimed in claim 1, wherein each of the first light-emitting elements and the second light-emitting element comprises a light-emitting diode chip.

6. A light-emitting device, comprising:
   a package housing providing a recess;
   a first light-emitting element disposed in the recess;
   a plurality of first miniature elements formed on the first light-emitting element, wherein light from the first light-emitting element passes through the first miniature elements is output to the exterior of the recess in a first direction
   a second light-emitting element disposed in the recess and separated from the first light-emitting element;
   a plurality of second miniature elements formed on the second light-emitting element, wherein light from the second light-emitting element passes through the second miniature elements to the exterior of the recess in a second direction;
   a third light-emitting element disposed in the recess and separated from the first and the second light-emitting elements; and
   a plurality of third miniature elements formed on the third light-emitting element, wherein light from the third light-emitting element passes through the third miniature elements to the exterior of the recess in a third direction;
   wherein at least two of the first direction, the second direction, and the third direction cross each other, and at least two of the first miniature elements, the second miniature elements, and the third miniature elements have different shapes.

7. The light-emitting device as claimed in claim 6, wherein each of the first miniature elements comprises a triangular pyramid.

8. The light-emitting device as claimed in claim 6, wherein each of the first miniature elements comprises a square-based pyramid.

9. The light-emitting device as claimed in claim 6, wherein each of the first miniature elements comprises a cone.

10. The light-emitting device as claimed in claim 6, wherein the first, the second, and the third light-emitting elements comprise a light-emitting diode chip, respectively.

11. The light-emitting device as claimed in claim 6, wherein the first light-emitting element comprises a red-light light-emitting diode chip, the second light-emitting element comprises a green-light light-emitting diode chip, and the third light-emitting element comprises a blue-light light-emitting diode chip.

12. The light-emitting device as claimed in claim 6, further comprising a package filler filled in the recess and covering the first, the second, and the third light-emitting elements.

* * * * *